US012706331B2

(12) United States Patent
Yamashita et al.

(10) Patent No.: US 12,706,331 B2
(45) Date of Patent: Aug. 11, 2026

(54) BATTERY SYSTEM

(71) Applicant: DENSO CORPORATION, Kariya (JP)

(72) Inventors: Naoto Yamashita, Kariya-city (JP); Masahiko Ito, Kariya-city (JP); Masakazu Kouda, Kariya-city (JP); Hisanaga Onishi, Kariya (JP)

(73) Assignee: DENSO CORPORATION, Kariya (JP)

( * ) Notice: Subject to any disclaimer, the term of this patent is extended or adjusted under 35 U.S.C. 154(b) by 212 days.

(21) Appl. No.: 18/521,300

(22) Filed: Nov. 28, 2023

(65) Prior Publication Data

US 2024/0097219 A1 Mar. 21, 2024

Related U.S. Application Data

(63) Continuation of application No. 17/339,265, filed on Jun. 4, 2021, now Pat. No. 11,876,193, which is a (Continued)

(30) Foreign Application Priority Data

Dec. 4, 2018 (JP) ................................ 2018-227544

(51) Int. Cl.
*H01M 10/48* (2006.01)
*G01R 31/3835* (2019.01)
(Continued)

(52) U.S. Cl.
CPC ...... *H01M 10/482* (2013.01); *G01R 31/3835* (2019.01); *H01M 10/425* (2013.01);
(Continued)

(58) Field of Classification Search
None
See application file for complete search history.

(56) References Cited

U.S. PATENT DOCUMENTS 11,876,193 B2 * 1/2024 Yamashita ............ H01M 50/51
2003/0129457 A1 * 7/2003 Kawai ................. H01M 10/441 429/61
(Continued)

FOREIGN PATENT DOCUMENTS

JP 2006-275846 A 10/2006
JP 2009-213297 A 9/2009
(Continued)

OTHER PUBLICATIONS

Dec. 24, 2019 International Search Report issued in International Patent Application No. PCT/JP2019/046587.

*Primary Examiner* — Jas A Sanghera
(74) *Attorney, Agent, or Firm* — Oliff PLC

(57) ABSTRACT

A battery system comprises a plurality of battery modules, each of the battery modules includes an assembled battery configured to include a plurality of battery cells connected in series, a monitoring unit configured to monitor the assembled battery, and an external member configured to be electrically connected to the monitoring unit, and the monitoring unit of each of the battery modules has a generation unit configured to generate, based on an electric signal input from the external member, an identification information item on the corresponding one of the battery modules, the identification information items of the respective battery modules being different from one another.

21 Claims, 6 Drawing Sheets

Related U.S. Application Data continuation of application No. PCT/JP2019/046587, filed on Nov. 28, 2019.

(51) Int. Cl.

| | |
|---|---|
| ***H01M 10/42*** | (2006.01) |
| ***H01M 50/51*** | (2021.01) |
| ***H02J 7/40*** | (2026.01) |
| *H02J 7/61* | (2026.01) |
| *H02J 7/63* | (2026.01) |

(52) U.S. Cl.

CPC ......... *H01M 10/48* (2013.01); *H01M 10/486* (2013.01); *H01M 50/51* (2021.01); *H02J 7/40* (2026.01); *H01M 2010/4271* (2013.01); *H02J 7/61* (2026.01); *H02J 7/63* (2026.01)

(56) References Cited

U.S. PATENT DOCUMENTS

| | | | | |
|---|---|---|---|---|
| 2006/0163351 | A1 | 7/2006 | Kuriki et al. | |
| 2011/0004438 | A1* | 1/2011 | Baglino | H01M 10/4207 702/150 |
| 2011/0258471 | A1 | 10/2011 | Daniel et al. | |
| 2013/0181513 | A1* | 7/2013 | Yano | B60L 53/14 307/43 |
| 2014/0354291 | A1 | 12/2014 | Kikuchi et al. | |
| 2016/0009182 | A1* | 1/2016 | Nakanishi | B60L 53/11 701/22 |
| 2016/0254687 | A1 | 9/2016 | Tanaka et al. | |
| 2016/0294019 | A1 | 10/2016 | Yamauchi et al. | |
| 2019/0235027 | A1 | 8/2019 | Sugiura et al. | |
| 2020/0178378 | A1 | 6/2020 | Sasahara et al. | |
| 2021/0296714 | A1 | 9/2021 | Yamashita et al. | |
| 2021/0336301 | A1* | 10/2021 | Hwang | H01M 10/486 |
| 2021/0367277 | A1* | 11/2021 | Takechi | H01M 10/482 |

FOREIGN PATENT DOCUMENTS

| | | | |
|---|---|---|---|
| JP | 2010-019791 | A | 1/2010 |
| JP | 2013-239394 | A | 11/2013 |
| JP | 2016-219309 | A | 12/2016 |

* cited by examiner

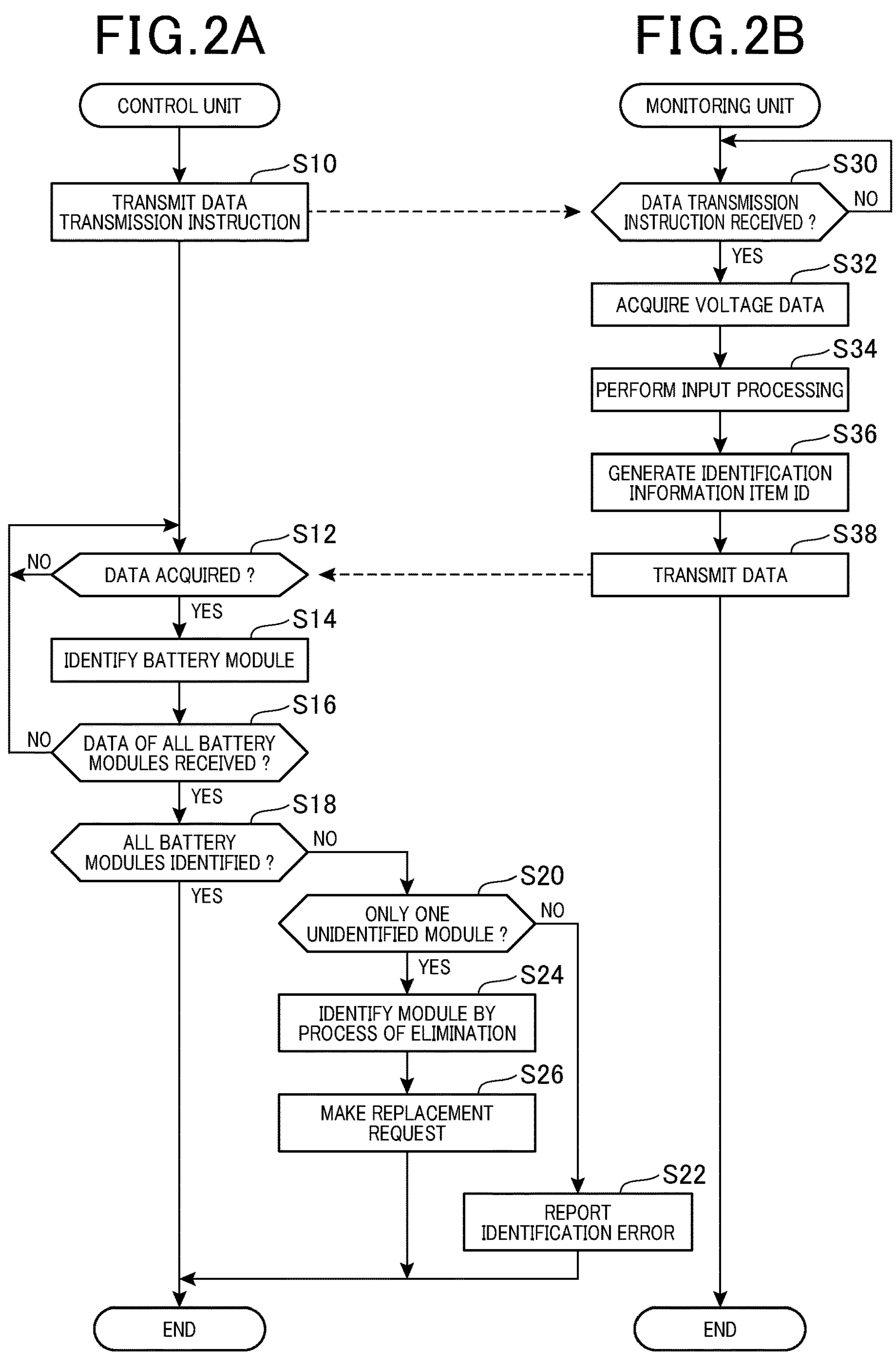
FIG.2A
FIG.2B
CONTROL UNIT
S10
TRANSMIT DATA TRANSMISSION INSTRUCTION
S12
DATA ACQUIRED ?
NO
YES
S14
IDENTIFY BATTERY MODULE
S16
DATA OF ALL BATTERY MODULES RECEIVED ?
NO
YES
S18
ALL BATTERY MODULES IDENTIFIED ?
NO
YES
S20
ONLY ONE UNIDENTIFIED MODULE ?
NO
YES
S24
IDENTIFY MODULE BY PROCESS OF ELIMINATION
S26
MAKE REPLACEMENT REQUEST
S22
REPORT IDENTIFICATION ERROR
END
MONITORING UNIT
S30
DATA TRANSMISSION INSTRUCTION RECEIVED ?
NO
YES
S32
ACQUIRE VOLTAGE DATA
S34
PERFORM INPUT PROCESSING
S36
GENERATE IDENTIFICATION INFORMATION ITEM ID
S38
TRANSMIT DATA
END

| BATTERY MODULE | IDENTIFICATION INFORMATION ITEM ID |
|---|---|
| M1 | TDA1<br>TDA2<br>TDA3<br>ND |
| M2 | TDA1<br>TDA2<br>ND<br>TDA3 |
| M3 | TDA1<br>ND<br>TDA2<br>TDA3 |

| BATTERY MODULE | IDENTIFICATION INFORMATION ITEM ID |
| --- | --- |
| M1 | TDA1<br>TDA2<br>TDA3<br>TDB1 |
| M2 | TDA1<br>TDA2<br>TDB1<br>TDA3 |
| M3 | TDA1<br>TDB1<br>TDA2<br>TDA3 |

BATTERY SYSTEM

CROSS-REFERENCE TO RELATED APPLICATION

The present application is a continuation application of U.S. patent application Ser. No. 17/339,265, filed on Jun. 4, 2021, which is a continuation application of International Application No. PCT/JP2019/046587, filed on Nov. 28, 2019, which claims priority to Japanese Patent Application No. 2018-227544, filed on Dec. 4, 2018. The contents of these applications are incorporated herein by reference in their entirety.

BACKGROUND

Technical Field

The present disclosure relates to a battery system.

Background Art

A conventional, known battery system used in, for example, an electric vehicle, includes a plurality of battery modules in order to support a wide range of electrification (for example, PTL 1). In such a battery system, the control unit for controlling each battery system needs to identify each battery module in order to perform tasks such as monitoring the charge state of each battery module and performing failure diagnosis. In the technique described in PTL 1, an unique identification information item is preset in the monitoring unit for monitoring an assembled battery for each battery module, and the control unit identifies the battery modules using the identification information items.

SUMMARY

In the present disclosure, provided is a battery system as the following.

The battery system includes a plurality of battery modules, each of the battery modules includes an assembled battery, a monitoring unit, and a temperature sensor. The monitoring unit of each of the battery modules includes: a connector configured to include a plurality of terminals, at least one of the plurality of terminals serving as an unused terminal, electrical wirings being connected to the connector such that the unused terminal of the corresponding one of the battery modules is different from the unused terminal of another one of the battery modules; a generation unit configured to generate, based on the voltage signals input to the respective terminals, an identification information item on the corresponding one of the battery modules, the identification information items of the respective battery modules being different from one another; and an input processing unit configured to: perform input processing on the voltage signals with a predetermined voltage range; and cause a voltage at the unused terminal to be outside the predetermined voltage range.

BRIEF DESCRIPTION OF THE DRAWINGS

The above and other objects, features, and advantages of the present disclosure will become clearer from the following detailed description with reference to the accompanying drawings. In the drawings.

FIG. 2A is a flowchart showing the identification process; and FIG. 2B is a flowchart showing the identification information generation process.

DETAILED DESCRIPTION OF THE PREFERRED EMBODIMENTS

[PTL 1] JP 5710013 B

Figure 1:
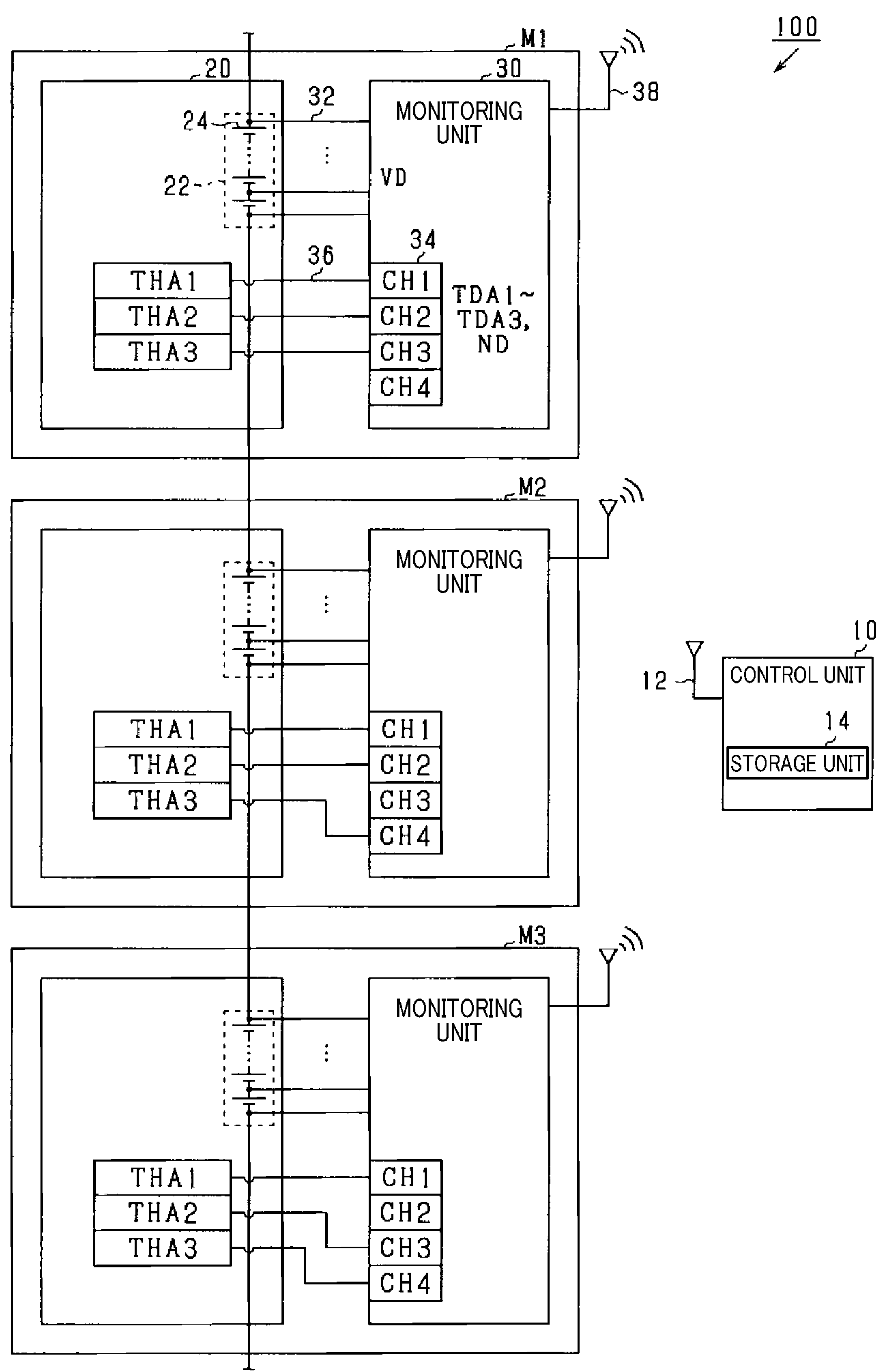
FIG. 1 is a configuration diagram showing an outline of a power supply system of a vehicle according to a first embodiment.

However, it is desirable to standardize the monitoring units included in the battery modules of a battery system including a plurality of battery modules for reasons such as cost reduction. However, in the above example, since the identification information items set in the respective monitoring units are different from each other, the monitoring units in the battery modules cannot be standardized.

The present disclosure aims to solve the above problems, and an object of the present disclosure is to provide a battery system capable of standardizing the monitoring units included in the battery modules.

The present disclosure presents a battery system comprising a plurality of battery modules, each of the battery modules comprising: an assembled battery configured to include a plurality of battery cells connected in series; a monitoring unit configured to monitor the assembled battery; and a temperature sensor configured to be electrically connected to the monitoring unit. The monitoring unit of each of the battery modules comprises: a connector configured to include a plurality of terminals and be connected to a plurality of electric wirings extending from the temperature sensor, at least one of the plurality of terminals serving as an unused terminal, the electrical wirings being connected to the connector such that the unused terminal of the corresponding one of the battery modules is different from the unused terminal of another one of the battery modules, the temperature sensor being configured to output voltage signals to the respective terminals of the connector; a generation unit configured to generate, based on the voltage signals input to the respective terminals, an identification information item on the corresponding one of the battery modules, the identification information items of the respective battery modules being different from one another; and an input processing unit configured to: perform input processing on the voltage signals outputted from the temperature sensor with a predetermined voltage range; and cause a voltage at the unused terminal to be outside the predetermined voltage range.

Each of the battery modules includes a monitoring unit and a temperature sensor electrically connected to the monitoring unit. The monitoring unit generates, based on the voltage signals input to the respective terminals, an identification information item on the corresponding one of the battery modules, the identification information items of the respective battery modules being different from one another. Since each monitoring unit can generate the identification information items based on the electrical signals outputted from the temperature sensor, there is no need to set the identification information items internally. As a result, the monitoring units can be standardized across the battery modules constituting the battery system.

First Embodiment

A first embodiment of a battery system according to the present disclosure will be described below with reference to the drawings. The battery system 100 of this embodiment is mounted on a vehicle.

As shown in FIG. 1, the battery system 100 includes three battery modules M1 to M3 and a control unit 10. Each of the battery modules M1 to M3 includes a cell module 20 and a monitoring unit 30.

The cell module 20 includes an assembled battery 22 having a plurality of battery cells 24 connected in series. Three temperature sensors THA1 to THA3 for detecting the temperature of the assembled battery 22 are provided near the assembled battery 22. Each of the temperature sensors THA1 to THA3 detects the temperature of a different part of the assembled battery 22 and outputs a voltage signal corresponding to the detected temperature. The temperature sensors THA1 to THA3 may be, for example, temperature sensitive diodes or thermistors. In this embodiment, the temperature sensors THA1 to THA3 correspond to the “external member”.

The monitoring unit 30 monitors the assembled battery 22. The monitoring unit 30 is connected to the two electrodes of each of the battery cells 24 constituting the assembled battery 22 via detection lines 32 to detect the voltage of each battery cell 24 (voltage between terminals) and thereby obtain cell voltage data VD, which is a voltage signal corresponding to the corresponding one of the battery cells 24.

The monitoring unit 30 is provided with a connector 34. The connector 34 has four terminals CH1 to CH4 that can be connected to the temperature sensors THA1 to THA3. Electrical wirings 36 extending from the temperature sensors THA1 to THA3 are connected to the connector 34 so that the monitoring unit 30 and the temperature sensors THA1 to THA3 are electrically connected. The monitoring unit 30 acquires temperature data TDA1 to TDA3 based on the voltage signals input from the temperature sensors THA1 to THA3 via the connector 34.

The electrical wirings 36 are connected in a one-to-one relationship with the terminals CH1 to CH4 of the connector 34. In the present embodiment, the number of the terminals CH1 to CH4 of the connector 34 is greater than the number of the temperature sensors THA1 to THA3 by one. Therefore, one of the terminals CH1 to CH4 of the connector 34 would be an unused terminal that is not connected to any of the temperature sensors THA1 to THA3. Which of the terminals CH1 to CH4 of the connector 34 is to be an unused terminal can be freely decided by the operator during the manufacturing of the battery modules M1 to M3.

The monitoring unit 30 includes a communication circuit 38 for wirelessly transmitting the acquired cell voltage data VD and temperature data TDA1 to TDA3 to the control unit 10. Further, the monitoring unit 30 wirelessly receives various instructions from the control unit 10 via the communication circuit 38.

Next, the control unit 10 will be described. The main component of the control unit 10 is a microcomputer including a CPU, a ROM, a RAM, and the like, and the control unit controls the battery modules M1 to M3 individually by executing various control programs stored in the ROM.

The control unit 10 is configured to be able to communicate with the monitoring unit 30 of each battery module M1 to M3. Specifically, the control unit 10 includes a communication circuit 12 for wirelessly receiving the cell voltage data VD and temperature data TDA1 to TDA3 wirelessly transmitted by the monitoring unit 30. The control unit 10 controls the assembled batteries 22 using the received cell voltage data VD and temperature data TDA1 to TDA3. For example, the control unit 10 calculates the SOC (State of Charge) of each assembled battery 22 using the received cell voltage data VD and the temperature data TDA1 to TDA3. Then, it wirelessly transmits an instruction for preventing the assembled battery 22 from being overcharged or overdischarged to the monitoring unit 30 via the communication circuit 12.

In the battery system 100, in order to perform tasks such as monitoring the SOC and performing failure diagnosis for each of the battery modules M1 to M3, it is necessary for the control unit 10 to identify the battery modules M1 to M3. For example, a case where an unique identification information item ID is set for the monitoring unit 30 of each of the battery modules M1 to M3 is considered. The form of setting the identification information items ID includes the identification information items ID being stored in the storage of the monitoring unit 30. In this case, the control unit 10 can identify the battery modules M1 to M3 by acquiring the identification information item ID set for the monitoring unit 30 through wireless communication with the monitoring unit 30.

There is a demand to standardize the monitoring units 30 included in the battery modules M1 to M3 of a battery system 100 for reasons such as cost reduction. However, since the identification information item on the corresponding one of the battery modules M1 to M3 is set in the monitoring unit 30 in the above case, the identification information items of the respective battery modules being different from one another, the monitoring units 30 cannot be standardized across the battery modules M1 to M3.

In order to solve the above problem, in the battery system 100 of the present embodiment, the monitoring unit 30 generates, based on the voltage signals input from the temperature sensors THA1 to THA3, the identification information item on the corresponding one of the battery modules M1 to M3, the identification information items of the respective battery modules being different from one another. Specifically, the connection patterns between the temperature sensors THA1 to THA3 and the terminals CH1 to CH4 of the connector 34 are arranged to be different for each of the battery modules M1 to M3, and also, they are arranged so that the unused terminal not connected to any of the temperature sensors THA1 to THA3 is different for each battery module. Therefore, the signals input to the terminals CH1 to CH4 are different for each of the battery modules M1 to M3.

The monitoring unit 30 performs an identification information generating process for generating an identification information item ID based on the signals input to the terminals CH1 to CH4. Since the monitoring unit 30 can generate the identification information items ID based on the voltage signals input from the temperature sensors THA1 to THA3, there is no need to set the identification information items ID internally. As a result, the monitoring units 30 can be standardized across the battery modules M1 to M3 constituting the battery system 100.

FIG. 2 shows flowcharts of the identification process and the identification information generating process according to the present embodiment. The identification process is a process of identifying the battery modules M1 to M3 using identification information items ID generated by the identification information generating process, and it is performed by the control unit 10. FIG. 2(*a*) is a flowchart showing the identification process which is performed by the control unit 10, and FIG. 2(*b*) is a flowchart showing the identification information generating process which is performed by the monitoring units 30. The control unit 10 and the monitoring units 30 perform their respective processes when the vehicle is started, that is, when the ignition switch of the vehicle is switched on.

First, the identification information generating process performed by the monitoring units 30 will be described. When a monitoring unit 30 starts the identification information generating process, it first determines in step S30 whether a data transmission instruction has been received from the control unit 10.

If it is determined that a data transmission instruction has not been received from the control unit 10 in step S30, step S30 is repeated. On the other hand, if it is determined that a data transmission instruction has been received from the control unit 10 in step S30, cell voltage data VD is acquired in step S32. In the following step S34, input processing for acquiring temperature data TDA1 to TDA3 is performed based on the voltage signals input from the temperature sensors THA1 to THA3. Note that, in this embodiment, the process of step S34 corresponds to the "input processing unit".

Figures 3, 4:
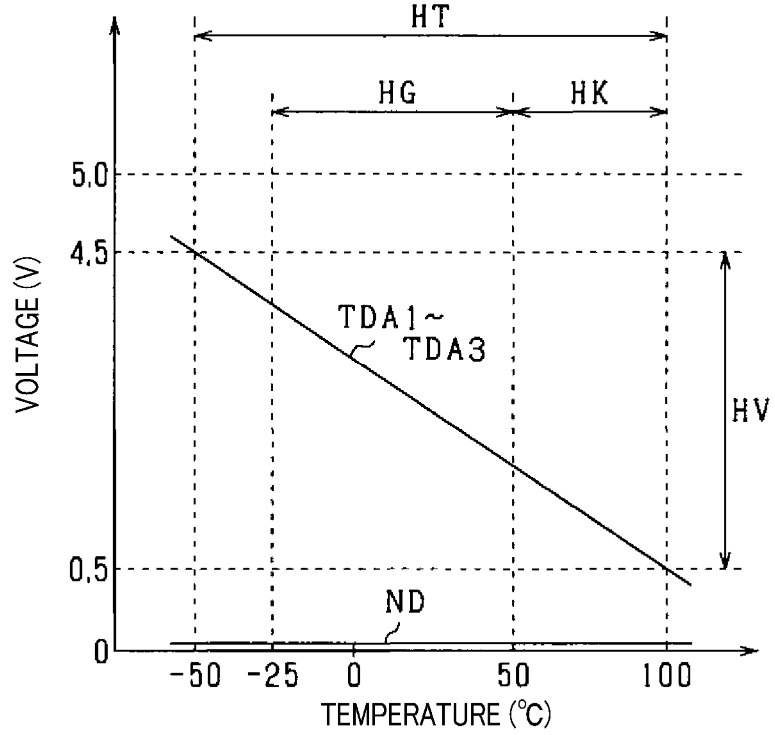
FIG. 3 is a diagram showing the relationship between the battery modules and the identification information items according to the first embodiment.
FIG. 4 is a diagram showing the temperature characteristics of the temperature data and the out-of-range data.

In step S34, the monitoring unit 30 performs input processing on the voltage signals outputted from the temperature sensors THA1 to THA3 input to those terminals among the terminals CH1 to CH4 of the connector 34 that are connected to the temperature sensors THA1 to THA3, within a predetermined voltage range HV (see FIG. 4). Specifically, the monitoring unit converts the voltage signals, which are analog signals corresponding to the temperature of the assembled battery 22, into temperature data TDA1 to TDA3, which are digital signals indicating voltage values within the predetermined voltage range HV. The predetermined voltage range HV is, for example, a voltage range from 0.5 V to 4.5 V.

On the other hand, no voltage signal is input to the unused one of the terminals CH1 to CH4 of the connector 34, and the voltage of the unused terminal is set to a constant voltage such as ground voltage. The monitoring unit 30 causes the voltage of the unused terminal to be a voltage outside the predetermined voltage range HV. Specifically, the monitoring unit 30 generates out-of-range data ND, which is a digital signal indicating a voltage value outside the predetermined voltage range HV, as the voltage of the unused terminal. The voltage value of the out-of-range data ND is, for example, 0 V.

In step S36, the identification information item ID is generated. Specifically, the identification information item ID is generated by arranging the data that has been input-processed in step S34 in the order of the terminals CH1 to CH4 of the connector 34. Therefore, the identification information item ID includes three pieces of temperature data TDA1 to TDA3 and one piece of out-of-range data ND. In the present embodiment, the unused terminal is different for each of the battery modules M1 to M3 in the present embodiment, and the order of the temperature data TDA1 to TDA3 and the out-of-range data ND is different for each of the battery modules M1 to M3. Therefore, the identification information item on the corresponding one of the battery modules M1 to M3 is generated, the identification information items of the respective battery modules being different from one another. Note that, in this embodiment, the process of step S36 corresponds to the "generating unit".

In the following step S38, data including the cell voltage data VD and the identification information item ID are transmitted to the control unit 10, and the identification information generating process ends.

Next, the identification process performed by the control unit 10 will be described. When the control unit 10 starts the identification process, first, in step S10, it transmits data transmission instructions to the monitoring units 30 of the battery modules M1 to M3. In the following step S12, it is determined whether data has been acquired from the monitoring units 30 of the battery modules M1 to M3. Note that, in this embodiment, the process of step S12 corresponds to the "identification information acquiring unit".

If it is determined that data has not been acquired from the monitoring units 30 of the battery modules M1 to M3 in step S12, step S12 is repeated. On the other hand, if it is determined that data has been acquired from the monitoring units 30 of the battery modules M1 to M3 in step S12, identification of the battery modules M1 to M3 whose data have been acquired in step S12 are carried out in step S14. Note that, in this embodiment, the process of step S14 corresponds to the "identification unit".

In step S14, the control unit 10 uses a map MP (see FIG. 3) stored in a storage unit 14 (see FIG. 1) of the control unit 10 to identify the battery modules M1 to M3 based on the identification information item ID included in the data acquired in step S12. The storage unit 14 may include, for example, a ROM, a rewritable, non-volatile memory, or the like.

The map MP is correspondence information in which the battery modules M1 to M3 and the identification information items ID are associated with each other. In the map MP, the identification information items ID of the respective battery modules M1 to M3 included in the battery system 100 is stored in association with the corresponding battery module M1 to M3. In the present embodiment, the identification information items ID stored in the map MP are limited to the identification information items ID corresponding to the battery modules M1 to M3 included in the battery system 100.

In the following step S16, it is determined whether data has been acquired from all of the monitoring units 30 in the battery modules M1 to M3. If it is determined that data has not been acquired from all of the monitoring units 30 in the battery modules M1 to M3 in step S16, the process returns to step S12. On the other hand, if it is determined that data has been acquired from all of the monitoring units 30 in the battery modules M1 to M3 in step S16, it is determined in step S18 whether all the battery modules M1 to M3 have been identified.

If it is determined that all the battery modules M1 to M3 have been identified in step S18, the identification process ends. On the other hand, if it is determined that there is an unidentified module in step S18, it is determined in step S20 whether the number of unidentified modules is one. The cause of unidentified modules may be, for example, inaccurate identification information items ID being acquired due to a defective monitoring unit 30, or identification information items ID that are different from the identification information items ID stored in the map MP being acquired due to a defective temperature sensor THA1 to THA3.

If it is determined that the number of unidentified modules is not one in step S20, occurrence of an identification error in the battery modules M1 to M3 is reported in step S22, and the identification process ends. In this case, an identification error is an error where all the battery modules M1 to M3 cannot be identified. When an identification error occurs, the control unit 10 cannot appropriately acquire the voltage and temperature of the assembled battery 22 of each battery module M1 to M3, and it cannot appropriately control each battery module M1 to M3. Therefore, when an identification error occurs, the vehicle will not be started normally. Note that, the occurrence of an identification error may be notified by generating a warning sound, displaying the error on the display of a car navigation device, or by any other appropriate means.

On the other hand, when it is determined that the number of unidentified modules is one in step S20, the unidentified module is identified by process of elimination in step S24. Specifically, the one of the battery modules M1 to M3 associated with the identification information items ID that are not used in the identification of the battery modules M1 to M3 in the map MP is identified as the unidentified module.

In the following step S26, occurrence of a replacement request is reported, and the identification process ends. A replacement request is a request for prompting replacement of the unidentified module. When a replacement request is generated, although an unidentified module exists, the control unit 10 can identify all the battery modules M1 to M3, and appropriately acquire the voltage and temperature of the assembled batteries 22 of the battery modules M1 to M3. Therefore, when a replacement request is made, the vehicle will be started normally. Reporting generation of a replacement request makes it possible to prompt the driver to replace the unidentified module, which in turn prevents occurrence of an identification error.

Next, FIG. 3 shows the map MP. In the present embodiment, as shown in FIG. 1, in the battery module M1, the temperature sensor THA1 is connected to the terminal CH1 of the connector 34, the temperature sensor THA2 is connected to the terminal CH2, and the temperature sensor THA3 is connected to the terminal CH3. Therefore, as shown in FIG. 3, in the map MP, information in which the temperature data TDA1, the temperature data TDA2, the temperature data TDA3, and the out-of-range data ND are arranged in this order is stored as the identification information item ID corresponding to the battery module M1.

Similarly, in the battery module M2, the temperature sensor THA1 is connected to the terminal CH1 of the connector 34, the temperature sensor THA2 is connected to the terminal CH2, and the temperature sensor THA3 is connected to the terminal CH4. Therefore, in the map MP, information in which the temperature data TDA1, the temperature data TDA2, the out-of-range data ND, and the temperature data TDA3 are arranged in this order is stored as the identification information item ID corresponding to the battery module M2.

In the battery module M3, the temperature sensor THA1 is connected to the terminal CH1 of the connector 34, the temperature sensor THA2 is connected to the terminal CH3, and the temperature sensor THA3 is connected to the terminal CH4. Therefore, in the map MP, information in which the temperature data TDA1, the out-of-range data ND, the temperature data TDA2, and the temperature data TDA3 are arranged in this order is stored as the identification information item ID corresponding to the battery module M3.

Accordingly, for example, it is assumed that the control unit 10 obtains data from one of the monitoring units 30, and the identification information item ID included in the data is an information item in which the temperature data TDA1, the temperature data TDA2, the temperature data TDA3, and the out-of-range data ND are arranged in this order. In this case, the control unit 10 can identify the battery module from which the data has been acquired as the battery module M1.

Specifically, the control unit 10 divides the acquired identification information item ID into four pieces of voltage value data each indicating a voltage value, and then determines whether each voltage value indicated by the voltage value data is within the predetermined voltage range HV. When the voltage value indicated by the voltage value data falls within the predetermined voltage range HV, the control unit 10 determines that the voltage value data is temperature data TDA1 to TDA3. When the voltage value indicated by the voltage value data is outside the predetermined voltage range HV, it determines that the voltage value data is out-of-range data ND. When the voltage value data is temperature data TDA1 to TDA3, the voltage value indicated by the voltage value data falls within the predetermined voltage range HV regardless of the temperature of the assembled battery 22. Therefore, the control unit 10 can determine whether the voltage value data is temperature data TDA1 to TDA3 regardless of the temperature of the assembled battery 22.

After identifying the battery module M1, the temperature data TDA1 to TDA3 included in the identification information item ID is used to acquire the temperature of the assembled battery 22. That is, in the present embodiment, the temperature data TDA1 to TDA3 serves as data for identifying the battery module M1 and data for acquiring the temperature of the assembled battery 22. Therefore, there is no need to generate data for identifying the battery module M1 separately from the data for acquiring the temperature of the assembled battery 22.

FIG. 4 shows the temperature characteristics of the temperature data TDA1 to TDA3 and the out-of-range data ND. In the battery modules M1 to M3, a predetermined temperature range HT is preset as a temperature range in which the assembled battery 22 can operate. When the temperature of the assembled battery 22 is within the predetermined temperature range HT, the monitoring unit 30 performs input processing on the voltage signals outputted from the temperature sensors THA1 to THA3 with the predetermined voltage range HV, and generates pieces of temperature data TDA1 to TDA3 which indicate voltage values that are within the predetermined voltage range HV. Specifically, the input processing is performed so that the voltage linearly changes within the predetermined voltage range HV in accordance with the temperature change of the assembled battery 22 within the predetermined temperature range HT, and more specifically, the input processing is performed so that the temperature characteristics would show an inverse relationship where the voltage decreases when the temperature increases.

The predetermined temperature range HT includes an outside air temperature range HG and a high temperature range HK. The outside air temperature range HG is a temperature range corresponding to the outside air temperature, and the vehicle is generally started at a temperature within this outside air temperature range HG. The high temperature range HK is a temperature range on the higher temperature side of the outside air temperature range HG. In this embodiment, in the input processing for the identification process, the voltage signals outputted from the temperature sensors THA1 to THA3 are input-processed so that the temperature characteristics would show an inverse relationship. Therefore, in the predetermined voltage range HV, the voltages corresponding to the outside air temperature range HG are higher than the voltages corresponding to the high temperature range HK.

In this embodiment, in accordance with the inverse relationship of the temperature characteristics, the voltage generated at the unused terminal outside the predetermined voltage range HV is a voltage that is on the lower voltage side of the predetermined voltage range HV, and out-of-range data ND is generated which indicates a voltage value that is lower than the predetermined voltage range HV. Therefore, as shown in FIG. 4, the voltage value difference between temperature data TDA1 to TDA3 in the outside air temperature range HG and the out-of-range data ND can be made relatively large. This facilitates distinguishing temperature data TDA1 to TDA3 from out-of-range data ND, and thus the identification information item ID can be appropriately identified.

According to the present embodiment described in detail above, the following effects can be obtained.

In the present embodiment, each of the battery modules M1 to M3 includes the monitoring unit 30 and the temperature sensors THA1 to THA3 electrically connected to the monitoring unit 30. The monitoring unit 30 of each of the battery modules generates, based on the electric signals input from the temperature sensors THA1 to THA3, the identification information item on the corresponding one of the battery modules M1 to M3, the identification information items of the respective battery modules being different from one another. Since the monitoring unit 30 can generate the identification information items ID based on the electrical signals input from the temperature sensors THA1 to THA3, there is no need to set the identification information items ID internally. As a result, the monitoring units 30 can be standardized across the battery modules M1 to M3 constituting the battery system 100.

In the present embodiment, the temperature sensors THA1 to THA3 are connected to the terminals CH1 to CH4 of the connector 34 such that the unused terminal of the connector 34 is different between the battery modules M1 to M3. Of the terminals CH1 to CH4 of the connector 34, the signals that are input to the terminals connected to the temperature sensors THA1 to THA3 are different from that input to the unused terminal. Therefore, configuring the connection such that each battery module M1 to M3 has a different unused terminal makes it possible that each battery module M1 to M3 has a different combination of signals input to the terminals CH1 to CH4 of the connectors 34, and the identification information items ID can be generated based on these signals.

In the present embodiment, the voltage signals input to those of the terminals CH1 to CH4 of the connector 34 that are connected to the temperature sensors THA1 to THA3 are input-processed within the predetermined voltage range HV, whereas the voltage of the unused terminal is processed as a voltage outside the predetermined voltage range HV. Therefore, the unused terminal can be identified from the input-processed data, and the battery modules M1 to M3 can be identified using the information items on the identified unused terminals as the identification information item ID.

In order to improve the accuracy of identification of the battery modules M1 to M3 based on the identification information items ID, it is desired that the identification information item ID itself is appropriately identified. Since the identification information item ID is composed of the temperature data TDA1 to TDA3 and the out-of-range data ND, it is necessary to appropriately distinguish the temperature data TDA1 to TDA3 from the out-of-range data ND. In general, a vehicle is started in the outside air temperature range HG, and the identification information items ID are generated in the outside air temperature range HG. Therefore, it is desired that the temperature data TDA1 to TDA3 is appropriately distinguished from the out-of-range data ND in the outside air temperature range HG.

In the present embodiment, voltages outside the predetermined voltage range HV, that is, the voltage values indicated by the out-of-range data ND are set using the magnitude relationship between the voltages corresponding to the outside air temperature range HG and the voltages corresponding to the high temperature range HK. For example, in the predetermined voltage range HV, when the voltages corresponding to the outside air temperature range HG are higher than the voltages corresponding to the high temperature range HK, voltages outside the predetermined voltage range HV are set to be voltages that are lower than the predetermined voltage range HV. This increases the voltage value difference between the temperature data TDA1 to TDA3 in the outside air temperature range HG and the out-of-range data ND. As a result, the temperature data TDA1 to TDA3 and the out-of-range data ND can be appropriately distinguished from each other, and the accuracy of identification of the battery modules M1 to M3 using the identification information items ID can be improved.

Second Embodiment

Figure 5:
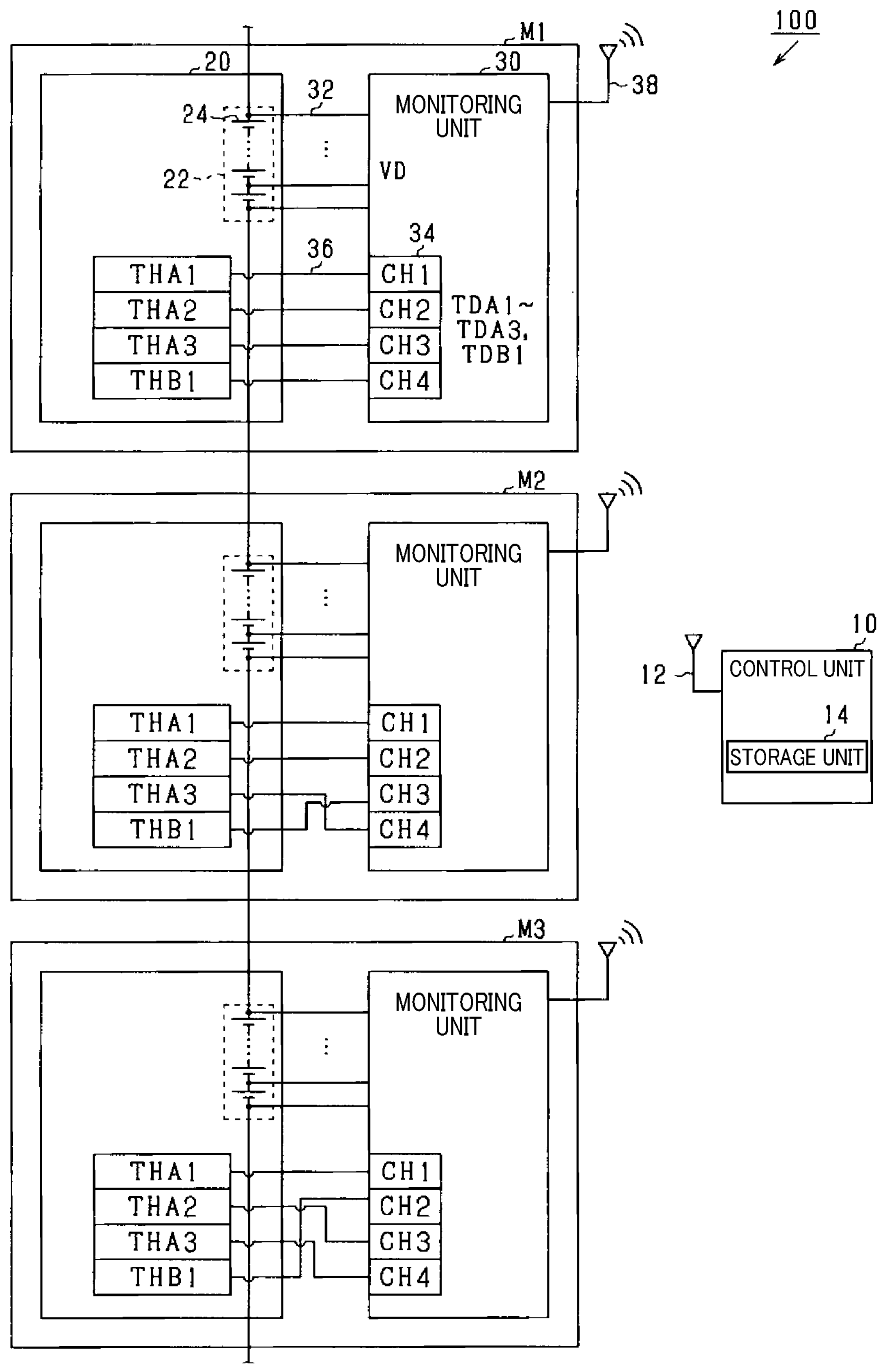
FIG. 5 is a configuration diagram showing an outline of a power supply system of a vehicle according to a second embodiment.

A second embodiment will now be explained with reference to FIGS. 5 to 7, focusing on its differences from the first embodiment. As shown in FIG. 5, this embodiment differs from the first embodiment in that the cell module 20 includes a temperature sensor THB1. The temperature sensors THA1 to THA3 will be hereinafter referred to as first sensors THA1 to THA3, and the temperature sensor THB1 will be referred to as a second sensor THB1.

The voltage level of the voltage signals outputted from the first sensors THA1 to THA3 according to the temperature of the assembled battery 22, differs from the voltage level of the signals outputted from the second sensor THB1 according to the temperature of the assembled battery 22. These voltage signals are input-processed to thereby obtain the first temperature data TDA1 to TDA3 of the first sensors THA1 to THA3 and the second temperature data TDB1 of the second sensor THB1. Therefore, even if the temperature of the assembled battery 22 is the same, the first temperature data TDA1 to TDA3, of the first sensors THA1 to THA3 has voltage values that are different from that of the second temperature data TDB1 of the second sensor THB1.

Figures 6, 7:
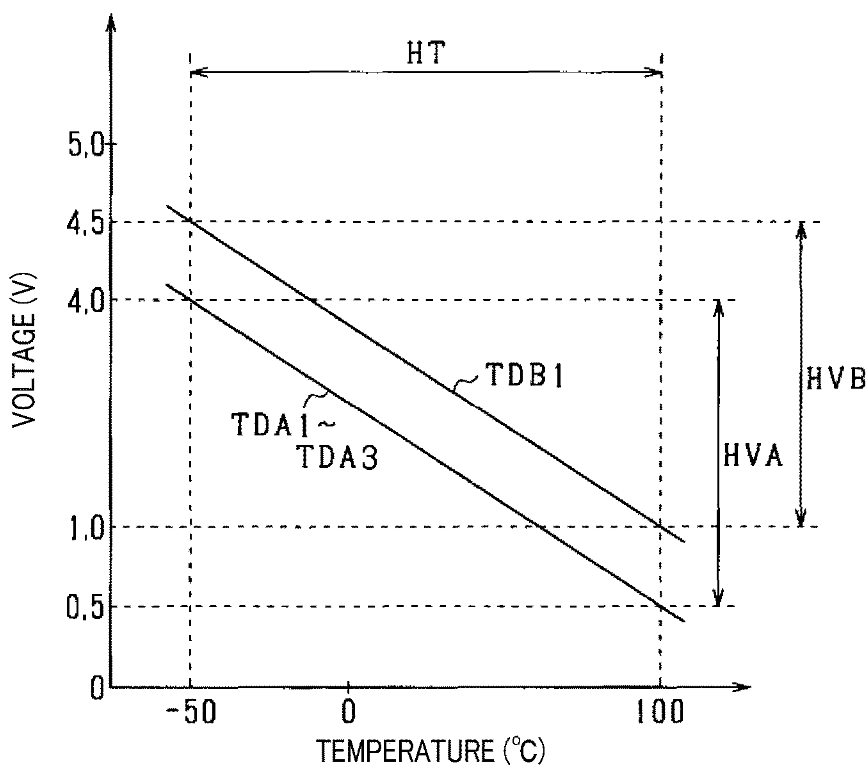
FIG. 6 is a diagram showing the temperature characteristics of the first temperature data and the second temperature data.
FIG. 7 is a diagram showing the relationship between the battery modules and the identification information items according to the second embodiment.

FIG. 6 shows the temperature characteristics of the first temperature data TDA1 to TDA3 and the second temperature data TDB1. As shown in FIG. 6, the output increase/ decrease characteristic with respect to the temperature of the assembled battery 22, that is, the increase/decrease characteristic of the voltage values indicated by the temperature data is the same for the first temperature data TDA1 to TDA3 and the second temperature data TDB1.

However, the voltage values indicated by the first temperature data TDA1 to TDA3 are offset to be higher than the voltage values indicated by the second temperature data TDB1. Therefore, the second voltage range HVB, which is the voltage range of the second temperature data TDB1, is offset to be higher than the first voltage range HVA, which is the voltage range of the first temperature data TDA1 to TDA3. The first voltage range HVA is, for example, a voltage range from 0.5 V to 4.0 V, and the second voltage range HVB is, for example. from 1.0 V to 4.5 V, and the offset is, for example, 0.5 V.

Further, the present embodiment is different from the first embodiment in that the connector 34 has no unused terminal. In this embodiment, the connection patterns of the first sensors THA1 to THA3 and the second sensor THB1 to the terminals CH1 to CH4 of the connector 34 are configured to be different between battery modules M1 to M3, so that the terminal to which the second sensor THB1 is connected is different in each of the battery modules M1 to M3.

FIG. 7 shows the map MP of this embodiment. In this embodiment, as shown in FIG. 5, in the battery module M1, the first sensor THA1 is connected to the terminal CH1 of the connector 34, the first sensor THA2 is connected to the terminal CH2, the first sensor THA3 is connected to the terminal CH3, and the second sensor THB1 is connected to the terminal CH4. Therefore, as shown in FIG. 7, in the map MP, information in which the first temperature data TDA1, the first temperature data TDA2, the first temperature data TDA3, and the second temperature data TDB1 are arranged in this order is stored as the identification information item ID corresponding to the battery module M1.

Similarly, in the battery module M2, the first sensor THA1 is connected to the terminal CH1 of the connector 34, the first sensor THA2 is connected to the terminal CH2, the second sensor THB1 is connected to the terminal CH3, and the first sensor THA3 is connected to the terminal CH4. Therefore, in the map MP, information in which the first temperature data TDA1, the first temperature data TDA2, the second temperature data TDB1, and the first temperature data TDA3 are arranged in this order is stored as the identification information item ID corresponding to the battery module M2.

In the battery module M3, the first sensor THA1 is connected to the terminal CH1 of the connector 34, the second sensor THB1 is connected to the terminal CH2, the first sensor THA2 is connected to the terminal CH3, and the first sensor THA3 is connected to the terminal CH4. Therefore, in the map MP, information in which the first temperature data TDA1, the second temperature data TDB1, the first temperature data TDA2, and the first temperature data TDA3 are arranged in this order is stored as the identification information item ID corresponding to the battery module M3.

Therefore, for example, it is assumed that the control unit 10 obtains data from a monitoring unit 30, and the data includes an identification information item ID in which the first temperature data TDA1, the first temperature data TDA2, the first temperature data TDA3, and the second temperature data TDB1 are arranged in this order. In this case, the control unit 10 identifies the battery module from which the data has been acquired as the battery module M1.

Specifically, the control unit 10 divides the acquired identification information item ID into four pieces of voltage value data each indicating a voltage value, and selects the piece of voltage value data indicating the largest voltage value from the four pieces of voltage value data. The control unit 10 determines that the selected piece of voltage value data is the second temperature data TDB1, and determines that the other pieces of voltage value data are the first temperature data TDA1 to TDA3. The first temperature data TDA1 to TDA3 and the second temperature data TDB1 can thus be determined, and each battery module M1 to M3 can be identified by using the identification information item ID composed of the temperature data TDA1 to TDA3 and TDB1.

According to the present embodiment described above, the temperature sensors THA1 to THA3 and THB1 are connected to the terminals CH1 to CH4 of the connector 34 such that the terminal to which the second sensor THB1 is connected is different for each battery module M1 to M3. The voltage signals of those of the terminals CH1 to CH4 of the connector 34 that are connected to the first sensors THA1 to THA3 have a voltage level that is different from that of the voltage signals of the terminal connected to the second sensor THB1. Therefore, connecting the electric wiring 36 such that the second sensor THB1 is connected to a different terminal in each battery module makes it possible to differentiate the combinations of signals input to the terminals CH1 to CH4 of the connectors 34 of the battery modules M1 to M3, and the identification information item ID can be generated based on the signals.

In this embodiment, the output increase/decrease characteristic with respect to the temperature of the assembled battery 22 is the same for the first temperature data TDA1 to TDA3 and the second temperature data TDB1, and, regardless of the temperature of the assembled battery 22, there is a constant difference, i.e., a constant offset between the voltage values of the first temperature data TDA1 to TDA3 and the voltage value of the second temperature data TDB1. As a result, regardless of the temperature of the assembled battery 22, the temperature data TDA1 to TDA3 and the out-of-range data ND can be determined with a constant accuracy, and the accuracy of identification of the battery modules M1 to M3 using the identification information items ID can be improved.

Third Embodiment

Figure 8:
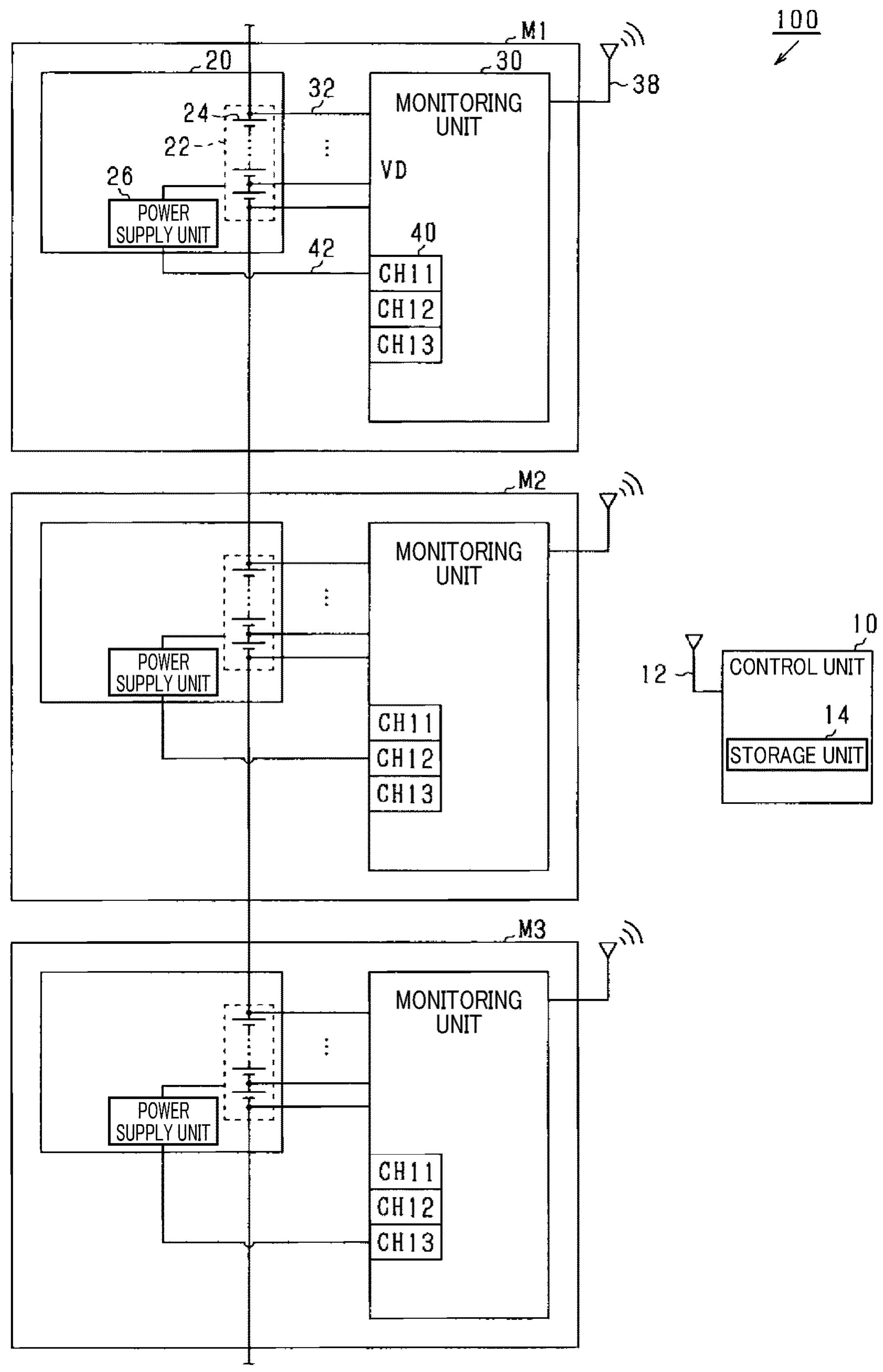
FIG. 8 is a configuration diagram showing an outline of a power supply system of a vehicle according to a third embodiment.

A third embodiment will now be explained with reference to FIG. 8, focusing on its differences from the first embodiment. As shown in FIG. 8, this embodiment is different from the first embodiment in that the cell module 20 includes a power supply unit 26 that supplies electric power to the monitoring unit 30 using the electric power of the assembled battery 22. Note that, in this embodiment, the power supply unit 26 corresponds to the “external member”.

The monitoring unit 30 is provided with a power supply connector 40. The power supply connector 40 has three power supply terminals CH11 to CH13 that can be connected to the power supply unit 26. A power supply line 42 extending from the power supply unit 26 is connected to the power supply connector 40 to supply power to the monitoring unit 30.

The power supply line 42 is connected to one of the power supply terminals CH11 to CH13. In this embodiment, of the power supply terminals CH11 to CH13, the one to which the power supply line 42 is connected is different in each of the battery module M1 to M3. Therefore, each battery module M1 to M3 can be identified by using the power supply terminal CH11 to CH13 to which the power supply line 42 is connected as the identification information items ID.

In this embodiment described above, each of the battery modules M1 to M3 includes the monitoring unit 30 and the power supply unit 26 electrically connected to the monitoring unit 30. Each monitoring unit 30 generates, based on the power supplied from the power supply unit 26, the identification information item ID on the corresponding one of the battery modules M1 to M3, the identification information items of the respective battery modules being different from one another. Since the monitoring unit 30 can generate the identification information items ID based on the power supplied from the power supply unit 26, there is no need to set the identification information item ID internally. As a result, the monitoring units 30 can be standardized across the battery modules M1 to M3 constituting the battery system 100.

Other Embodiments

The above embodiments may be modified as follows.

The number of battery modules is not limited to three, and instead there may be two, four, or more modules.

The external member may be a resistance connected to the monitoring unit 30. This resistance may be an internal resistance connected to the monitoring unit 30 inside the battery module M1 to M3, or may be an internal resistance connected to the monitoring unit 30 outside the battery module M1 to M3.

The first and second embodiments present examples where the temperature characteristics of the temperature data TDA1 to TDA3 show an inverse relationship in which the voltage decreases when the temperature increases. However, the present invention is not limited to this. The temperature characteristics may show a positive relationship in which the voltage increases when the temperature increases.

In the first embodiment, when the temperature characteristics of the temperature data TDA1 to TDA3 show a positive relationship, in the predetermined voltage range HV, the voltages corresponding to the outside air temperature range HG are lower than the voltages corresponding to the high temperature range HK. In this case, in accordance with the positive relationship of the temperature characteristics, a voltage outside the predetermined voltage range HV generated at the unused terminal may be a voltage that is higher than the predetermined voltage range HV, and the out-of-range data ND may be generated so that it indicates a voltage value that is higher than the predetermined voltage range HV. A voltage value higher than the predetermined voltage range HV is, for example, 5.0 V. As a result, there will be a relatively large difference between the voltage values of the temperature data TDA1 to TDA3 and that of the out-of-range data ND in the outside air temperature range HG.

In the first embodiment, the number of temperature sensors is not limited to three, and also the number of the terminals of the connector 34 is not limited to four. Therefore, the number of unused terminals of the connector 34 is not limited to one, and instead there may be two or more unused terminals.

The second embodiment presents an example in which the connector 34 does not have an unused terminal. However, the connector 34 may be provided with an unused terminal by, for example, reducing one first sensor. In this case, the first sensors THA1 to THA2 and the second sensor THB1 may be connected to the terminals CH1 to CH4 of the connector 34 so that each of the battery modules M1 to M3 has a different connection pattern. As a result, the battery modules M1 to M3 will have connection patterns in which the combination of the unused terminal and the terminal to which the second sensor THB1 is connected differs for each battery module M1 to M3. Many battery modules can be identified without increasing the number of terminals of the connector 34 by using the combination of the unused terminal and the terminal to which the second sensor THB1 is connected.

The above embodiments present examples in which the identification process and the identification information generating process are performed when the vehicle is started. However, the present invention is not limited to this. It may be carried out at the time the vehicle is assembled, or may be carried out at predetermined measurement intervals.

The above embodiments present examples in which the voltage indicated by the temperature data TDA1 to TDA3 changes linearly with temperature change of the assembled battery. However, the present invention is not limited to this. The voltage may change in a non-linear manner, for example, exponentially with temperature change.

The above embodiments present examples in which the control unit 10 and the monitoring unit 30 are not connected by a communication line, and the control unit 10 acquires data such as the identification information items ID from the monitoring unit 30 via wireless communication. However, the present invention is not limited to this. The control unit 10 and the monitoring unit 30 may be connected by a communication line so that the control unit 10 can acquire data such as the identification information items ID from the monitoring unit 30 via wired communication. For example, when the control unit 10 and multiple monitoring units 30 are connected in a ring by communication lines, it is possible to generate identification information items ID based on the order of connection of the monitoring units 30, but instead, the identification information items ID may be generated based on the electric signals input from external members.

Although the present disclosure is described based on examples, it should be understood that the present disclosure is not limited to the examples and structures. The present disclosure encompasses various modifications and variations within the scope of equivalence. In addition, the scope and the spirit of the present disclosure include other combinations and embodiments, only one component thereof, and other combinations and embodiments that are more than that or less than that.

What is claimed is:

1. A battery system comprising a plurality of battery modules, each of the battery modules comprising:

an assembled battery that includes a plurality of battery cells connected in series;

a monitoring unit configured to monitor the assembled battery; and an external member electrically connected to the monitoring unit, wherein the monitoring unit is configured to generate an identification information item on each of the battery modules based on an electrical signal input from the external member, the identification information items of the respective battery modules being different from one another, and the battery system further comprises a control unit that is communicable with the monitoring unit of each of the battery modules, the control unit comprising:

an identification unit configured to identify each of the battery modules based on the identification information item on each of the battery modules, and an abnormality determining unit configured to determine that an identification abnormality has occurred in response to at least one of the plurality of battery modules being an unidentifiable module that cannot be identified by the identification information item.

2. The battery system according to claim 1, wherein the abnormality determining unit is configured to, in response to the at least one of the plurality of battery modules being the unidentifiable module, determine how many of the at least one of the plurality of battery modules are the unidentifiable modules.

3. The battery system according to claim 1, wherein the control unit is configured to notify an occurrence of the identification abnormality in response to the abnormality determining unit determining that the identification abnormality has occurred.

4. The battery system according to claim 1, wherein the control unit is configured to notify a request for replacement of the unidentifiable module in response to the abnormality determining unit determining that the identification abnormality has occurred.

5. The battery system according to claim 1, wherein the control unit is configured to identify the unidentifiable module by associating it with an identification information item that is not used to identify any of the plurality of battery modules among a plurality of predetermined identification information items, in response to the abnormality determining unit determining that the identification abnormality has occurred.

6. The battery system according to claim 1, wherein the battery system is mounted on a vehicle, and in response to the abnormality determining unit determining that the identification abnormality has occurred, the vehicle is not started.

7. The battery system according to claim 1, wherein the control unit is communicable wirelessly with the monitoring unit of each of the battery modules, and the control unit is configured to notify a request for replacement of a corresponding one of the battery modules based on an identification result of the corresponding one of the battery modules.

8. The battery system according to claim 1, wherein the monitoring unit of each of the battery modules is not given unique information for individually identifying a corresponding one of the battery modules.

9. The battery system according to claim 1, wherein the monitoring unit of each of the battery modules comprises a connector that includes a plurality of terminals, the plurality of terminals including at least one unused terminal and at least one input terminal, the input terminal being input the electrical signal from the external member, and the identification information item is generated based on the electrical signal input to the at least one input terminal.

10. The battery system according to claim 1, wherein the external member is at least one of a resistance connected to the monitoring unit and a power supply unit that supplies power to the monitoring unit.

11. The battery system according to claim 1, wherein the control unit is configured to calculate a state of charge of each assembled battery using cell voltage data received from the monitoring units.

12. The battery system according to claim 1, wherein the monitoring unit of each of the battery modules is standardized.

13. A battery system comprising a plurality of battery modules, each of the battery modules comprising:

an assembled battery that includes a plurality of battery cells connected in series;

a monitoring unit configured to monitor the assembled battery; and an external member electrically connected to the monitoring unit, wherein the monitoring unit is configured to generate an identification information item on each of the battery modules based on an electrical signal input from the external member, the identification information items of the respective battery modules being different from one another, the battery system is applied to a vehicle, and the identification information item is generated for each of the battery modules at every predetermined cycle after the vehicle is started.

14. A battery system comprising a plurality of battery modules, each of the battery modules comprising:

an assembled battery that includes a plurality of battery cells connected in series;

a monitoring unit configured to monitor the assembled battery; and an external member electrically connected to the monitoring unit, wherein the monitoring unit is configured to generate an identification information item on each of the battery modules based on an electrical signal input from the external member, the identification information items of the respective battery modules being different from one another, the external member comprises:

at least one first sensor configured to output a first voltage signal indicative of a temperature of the assembled battery; and at least one second sensor configured to output a second voltage signal indicative of the temperature of the assembled battery, the second voltage signal having a voltage level different from that of the first voltage signal, the monitoring unit of each of the battery modules comprises a connector that includes a plurality of terminals that are connected to a plurality of electric wirings extending from the at least one first sensor and the at least one second sensor so as to form a connection pattern by which the first and second sensors are connected in a specific order to the plurality of terminals via the electric wirings, the connection pattern between the plurality of terminals of the connector and the at least one first sensor and the at least one second sensor being different for each of the battery modules so that (i) the specific order of connection between the first and second sensors and the plurality of terminals via the electric wirings of a first of the battery modules at least differs from (ii) the specific order of connection between the first and second sensors and the plurality of terminals via the electric wirings of a second of the battery modules, and the identification information item is generated based on one of the first voltage signal and the second voltage signal input to each of the plurality of terminals of the connector.

15. A battery system comprising a plurality of battery modules, each of the battery modules comprising:

an assembled battery that includes a plurality of battery cells connected in series; and a monitoring unit configured to monitor the assembled battery, wherein the battery system further comprises a control unit that is communicable wirelessly with the monitoring unit of each of the battery modules, the control unit is configured to:

perform an identification process for identifying each of the battery modules, and notify a request for replacement of a corresponding one of the battery modules based on the identification process of the corresponding one of the battery modules, each of the battery modules further comprises an external member electrically connected to the monitoring unit, and the monitoring unit is configured to generate an identification information item on each of the battery modules based on an electrical signal input from the external member, the identification information items of the respective battery modules being different from one another.

16. The battery system according to claim 15, wherein the control unit is configured to:

determine that an identification abnormality has occurred in response to at least one of the plurality of battery modules being an unidentifiable module, and notify a request for replacement of the unidentifiable module in response to determining that the identification abnormality has occurred.

17. The battery system according to claim 15, wherein the battery system is mounted on a vehicle, and in response to the control unit determining that at least one of the plurality of battery modules is unidentifiable, the vehicle is not started.

18. The battery system according to claim 15, wherein the monitoring unit of each of the battery modules is not given unique information for individually identifying a corresponding one of the battery modules.

19. The battery system according to claim 15, wherein the monitoring unit of each of the battery modules comprises a connector that includes a plurality of terminals, the plurality of terminals including at least one unused terminal and at least one input terminal, the input terminal being input the electrical signal from the external member, and the identification information item is generated based on the electrical signal input to the at least one input terminal.

20. The battery system according to claim 15, wherein the external member is at least one of a resistance connected to the monitoring unit and a power supply unit that supplies power to the monitoring unit.

21. The battery system according to claim 15, wherein the battery system is applied to a vehicle, and the identification information item is generated for each of the battery modules at least one of (i) when the vehicle is started, (ii) at every predetermined cycle after the vehicle is started, and (iii) when the battery system is assembled to the vehicle.

* * * * *